(12) United States Patent
Sullivan et al.

(10) Patent No.: US 10,700,043 B1
(45) Date of Patent: Jun. 30, 2020

(54) SOLID STATE POWER SWITCH WITH OPTIMIZED HEAT SINK CONFIGURATION

(71) Applicant: InPower LLC, Lewis Center, OH (US)

(72) Inventors: James D Sullivan, Lewis Center, OH (US); Richard Schweder, Lewis Center, OH (US)

(73) Assignee: InPower LLC, Lewis Center, OH (US)

( * ) Notice: Subject to any disclaimer, the term of this patent is extended or adjusted under 35 U.S.C. 154(b) by 0 days.

(21) Appl. No.: 16/827,288

(22) Filed: Mar. 23, 2020

(51) Int. Cl.
*H01L 25/07* (2006.01)
*H01L 23/367* (2006.01)
*H01L 23/50* (2006.01)

(52) U.S. Cl.
CPC .......... *H01L 25/072* (2013.01); *H01L 23/367* (2013.01); *H01L 23/50* (2013.01)

(58) Field of Classification Search
CPC ...... H01L 25/072; H01L 23/367; H01L 23/50
See application file for complete search history.

(56) References Cited

U.S. PATENT DOCUMENTS

| | | | |
|---|---|---|---|
| 5,311,398 A * | 5/1994 | Schirmer | B60R 16/0239 174/548 |
| 6,366,486 B1 * | 4/2002 | Chen | H02M 3/00 361/707 |
| 7,522,405 B2 | 4/2009 | Fogleman | |
| 2001/0045777 A1 * | 11/2001 | Onizuka | H05K 1/144 307/10.6 |

\* cited by examiner

*Primary Examiner* — Karen Kusumakar
(74) *Attorney, Agent, or Firm* — Frank H. Frank; Kremblas & Foster

(57) ABSTRACT

A high current, solid state, electrical switch has switch terminal blocks on opposite sides of one or more arrays of parallel connected, solid state, high current, power switching devices mounted on a support. A first terminal of each switching device of each array is directly electrically and thermally bonded to a switch terminal block. A bus bar thermal bridge is directly electrically and thermally bonded to a second terminal of the switching device of each array. A thermally conductive heat sink panel is contoured in alignment with, and has a surface in spaced juxtaposition from, a surface of the bus bar thermal bridge and from surfaces of each of the switch terminal blocks. A thermally conductive, electrically insulating thermal interface material thermally contacts and extends between all said surfaces for conducting heat from the switch terminal blocks and from the thermal bridge to the heat sink panel.

25 Claims, 5 Drawing Sheets

SOLID STATE POWER SWITCH WITH OPTIMIZED HEAT SINK CONFIGURATION

BACKGROUND OF THE INVENTION

This invention is directed generally to electronic, high current power switches for switching electrical currents. The invention is more specifically directed to the manner that the switch, including its internal solid state switching devices and its internal connections, are electrically and thermally connected to each other, to high current electrical cables and to a heat sink. The invention minimizes the generation of heat and optimizes the conduction of heat to a heat sink from the cables, the switch terminals, the solid state switching devices and the high current internal connections.

The manufacturers of solid state, high current power switching devices have continuously been developing switching devices that are increasingly less resistive because they have been able to construct them with increasingly more transistors that are connected in parallel on a substrate. Consequently, as the technology of solid state switching devices has advanced, switching devices have been able to carry an increasing amount of electrical current.

Typically, a switch that uses solid state switching devices mounts the devices, as well as the switch terminals for connecting to cables, on a circuit board. The amount of heat that is generated in many switches and the removal of that heat to prevent a temperature rise to damaging levels is not a design factor that must be considered for small signal applications. However, heat is one of the most important design factors that must be considered for high current applications. When a switch must carry high electrical currents when switched to its ON state, heat is generated in the switch components, especially in its solid state switching devices, and must be conducted from the heat-generating components to a lower temperature heat sink. The sources of heat in the switch include the solid state switching devices and internal high current connections to the switching devices and to the switch terminals.

An important application of high current switches is for switching electrical power to a variety of power tools, motors and other heavy equipment and machines that are mounted to vehicles, such as ambulances, emergency vehicles, work trucks, mobility vehicles, recreational vehicles and buses. Because of the high power that this equipment requires, the switches are connected to the equipment through cables that must be considerably larger than common wires. The cables have cable terminals that are attached to their ends. The cable terminals are connected to switch terminals that are a component of the electrical switch and are conventionally mounted on a circuit board. Cables, like other components that carry electrical current, have maximum continuous current ratings. If they carry a current above that rating their temperature rises noticeably. The sources of heat in a cable are the resistance of the cable conductor, the resistance between the cable conductor and the cable terminals, the resistance of the cable terminals and the resistance of the interfaces between the cable terminals and the switch terminals. Cables can be made to handle greater current by making the cable conductor and cable terminal larger in cross section and by reducing the resistance of the interfacing components. But those improvement result in an increased cost of additional metal material and manufacturing costs for reducing interface resistance.

U.S. Pat. No. 7,522,405 to Fogleman discloses a high current switch with solid state switching devices that are sandwiched between two rectangular bar conductors. Each bar conductor is connected to a cable. The Fogleman switch uses the cables as a heat sink and therefore relies on heat conduction into the cables from its solid state switching devices, from its internal conductors and from its switch terminals. Consequently, the cables should be designed not only to dissipate the heat generated by the current through the cables themselves but also to additionally dissipate the heat conducted into the cables from the switch components, including its solid state switching devices, as well as heat generated at terminal interfaces.

With the Fogleman switch, the heat dissipation in the cables can be sufficient if the design includes cables that are oversized beyond the size required for dissipating the heat generated in the cables themselves. Use of the proper gauge cable is critical. However, if cables are undersized because they were chosen based only upon the maximum continuous current that the cables are expected to carry, the heat transfer from the Fogleman high current switch into the cables may be inadequate and result in excessive switch temperature and damage to the switch. Unfortunately, in order to reduce cost, it is not uncommon for designers of high current circuits, such as those in vehicle electrical systems, to select cables that are rated at a lower maximum continuous current than is experienced by the switch during its normal operation. Any continuous current through the cable that exceeds the cable's maximum continuous current rating raises the cable temperature. The increased temperature at least reduces heat flow from the Fogleman switch into the cables. A sufficient temperature increase will cause the cables to be a heat source and reverse the heat flow causing heat to be transferred from the cables into the solid state switching devices and result in damage. Furthermore, if the electrical circuit experiences an overcurrent beyond the maximum expected or designed current, the excessive temperatures and resulting damage would be even more likely.

It is therefore an object and feature of the invention to provide a high current electrical switch using solid state switching devices that not only reduces the heat generated in the switch components but also more efficiently and effectively transfers heat from the switch components to a heat sink.

A further object and feature of the invention is to provide a high current switch with structural features that increase the rate of heat removal so the switch can be operated at a maximum continuous current through the switch and its connected cables that is greater than the rated maximum continuous current of the switching devices and consequently, the switch can be constructed from less expensive solid state switching devices.

A further object and feature of the invention to provide a high current electrical switch that also transfers heat out of, instead of into, cables that are attached to the electrical switch.

A still further object and feature of the invention is to provide a high current electrical switch that has a heat transfer path directly to its heat sink from a high current electrical conductor that series connects two arrays of parallel connected solid state switching devices within the switch.

A further object and feature of the invention is to provide a high current electrical switch that can save energy by operating at a lower temperature and therefore at a lower total series resistance.

SUMMARY OF THE INVENTION

The invention is an electrical switch having its high current electrical path as short as possible with high electrical conductivity and at the same time having a heat conduction path from its heat generating components to a heat sink that is physically short with high thermal conductivity. The heat conducting path conducts heat away from heat generating components at a heat flow rate that is capable of maintaining the switch's solid state, high current, power switching devices and all electrical conductors in the high current path, at temperatures that avoid damaging the devices or the circuit. The high electrical current path runs from one switch terminal directly to the switch's solid state, high current, power switching devices (e.g. MOS/FETs) and from the solid state, high current, power switching devices directly to the switch's second switch terminal. The high electrical current path includes a bus bar thermal bridge that connects to the second high current terminals of each high current, power switching device. The heat conduction path runs directly from the switch terminals and directly from the bus bar thermal bridge through a thermally conductive, electrically insulating thermal interface material to a thermally conductive heat sink panel. Preferably the heat sink panel is thermally connected to an infinite heat sink.

DETAILED DESCRIPTION OF THE INVENTION

Figure 1:
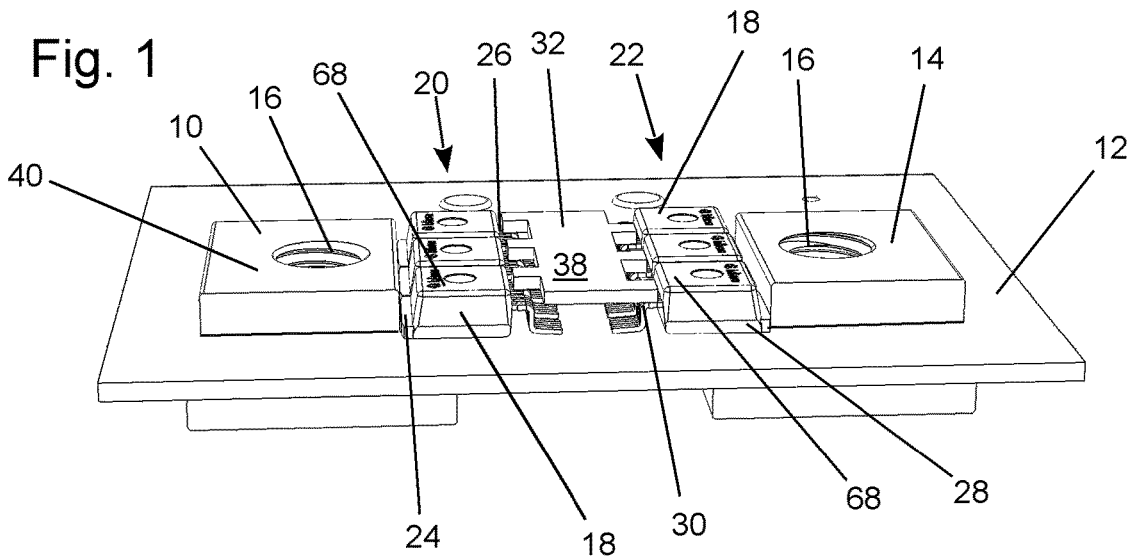
FIG. 1 is a view in perspective of the internal components of a preferred embodiment of the invention that is illustrated in FIGS. 1-7 with an "upper" side being most visible (the term "upper" is used with regard to the orientation shown in the drawings but the invention can be operated in any orientation).
Figure 2:
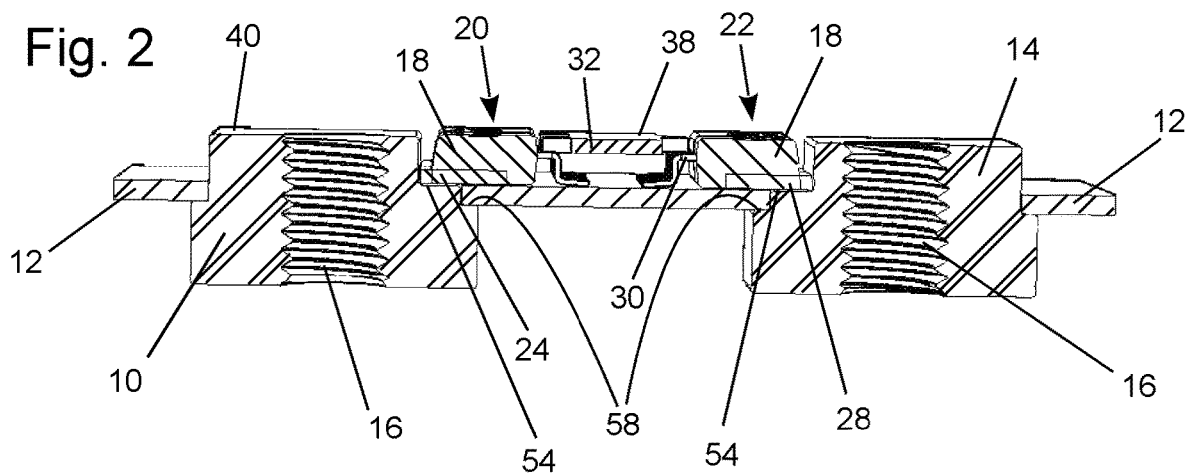
FIG. 2 is a view in section of the embodiment that is illustrated in FIGS. 1-7 taken substantially along the line 2-2 of FIG. 4.
Figure 3:
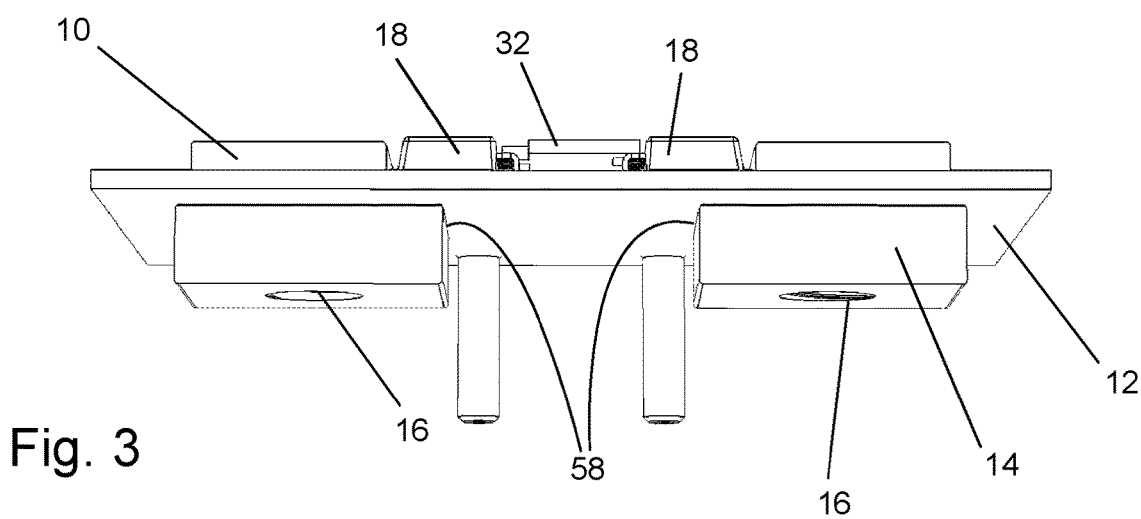
FIG. 3 is a view in perspective of the internal components that are illustrated in FIGS. 1-7 with the "lower" side exposed.
Figure 4:
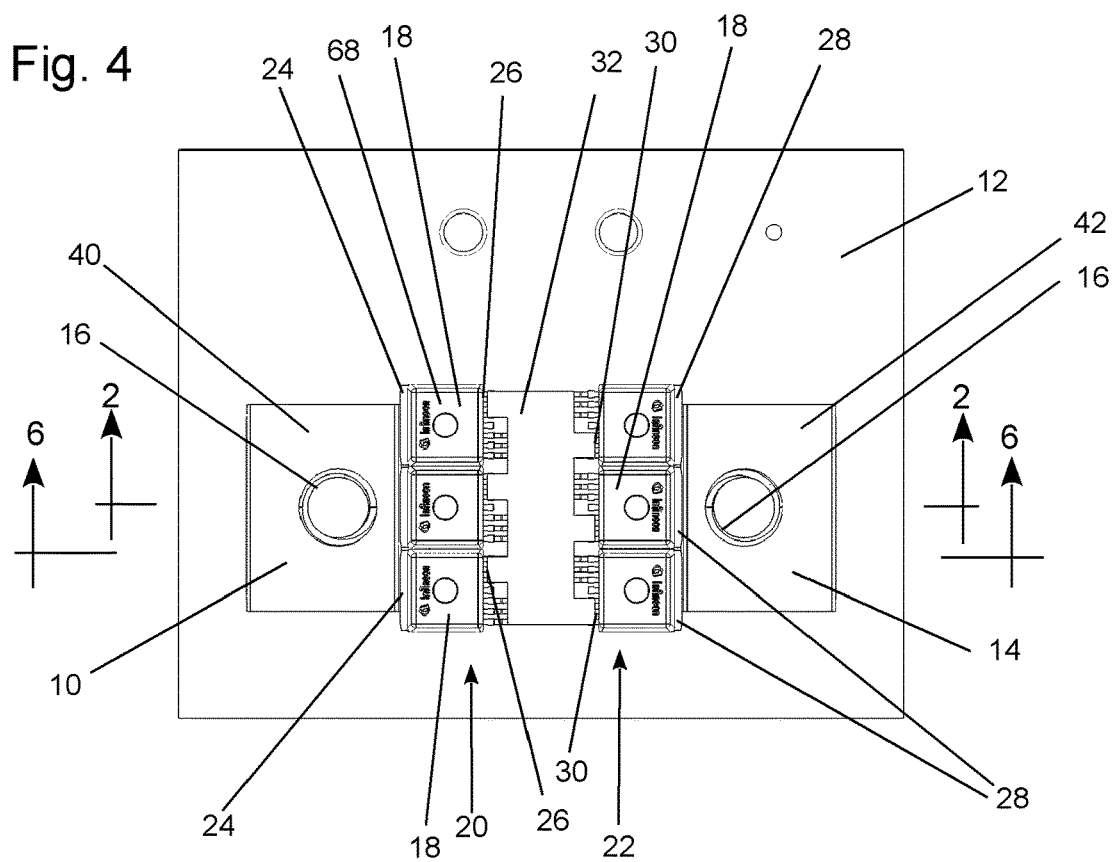
FIG. 4 is a top view of the internal components that are illustrated in FIGS. 1-7.

For the purpose of describing the invention, various engineering terms are used and defined in this specification. This invention is directed to electronic, high current, power switches for switching high electrical currents and uses solid state, high current, power switching devices. The term "high current" is a term of art but is used more specifically in this description to refer to electrical currents that equal to or exceed 50 amps. A "high current" component is a component that is designed to operate with a continuous current of at least 50 amperes. The high current in a switch is the current that is controlled and switched by the switch as distinguished from the currents that control the switching devices in the switch and currents that are sensed within the switch. The term "switch" refers to the entire switch including its switch terminals, its mechanical and physical components, its internal electrical connections and its power switching devices. The term "switch" most commonly refers to a circuit that switches between an ON state and an OFF state but can also refer to a circuit that modulates the amplitude or size of a current. The term "switching devices" or "devices" refers to solid state, power switching components such as MOS/FETs. Preferably, the term "high current" when applied to a component means not only a component that is constructed or configured for carrying a minimum of (at least) 50 amperes but also, during operation, experiences a temperature rise from heat generated ($I^2R$) in it of no more than 40 degrees C. The adjective "power" refers to a component that generates enough heat that, during operation, it requires heat transfer conductors and heat sinks.

FIGS. 1-7 illustrate the preferred embodiment of the invention although two of its components, its heat sink panel and its housing, are omitted from FIGS. 1-4 and 7 to better reveal its other components.

A first thermally conductive switch terminal block 10 is configured for carrying high electrical current and is mounted to a support 12 within an opening formed in the support 12. The support 12 is preferably a supporting board which can be, but is not necessarily, a printed circuit board. If a printed circuit board is used, it can carry the usual traces for small control signals but does not carry any of the high current that is being switched. A second thermally conductive switch terminal block 14 is also configured for carrying high electrical current and is mounted to the support 12 within an opening formed in the support 12. The second switch terminal block 14 is spaced from the first switch terminal block 10. Both terminal blocks 10 and 14 have threaded holes 16 for receiving screws (not illustrated) that fasten high current electrical cables, such as the cables commonly used in vehicle electrical systems, to the terminal blocks 10 and 14. The terminal blocks are preferably constructed from a metal that exhibits both a high thermal conductivity and a high electrical conductivity, most preferably copper.

Multiple solid state, high current, power switching devices 18 are physically supported on the support 12 between the first switch terminal block 10 and the second switch terminal block 14. [to avoid even more drawing clutter, not all switching devices 18 and not all of their terminals are connected by a lead line to a reference number] The switching devices 18 are arranged as a first array 20 of parallel connected, solid state, high current, power switching devices 18 and a second array 22 of parallel connected, solid state, high current, power switching devices 18. In the illustrated embodiment, the arrays 20 and 22 are each a linear row of switching devices 18.

Each switching device 18 in the first array 20 has a first array, high current, first terminal 24. Each switching device 18 in the first array 20 also has a first array, high current, second terminal 26. For the switching devices illustrated, the second terminals 26 are conventional integrated circuit pins that are connected in parallel for distributing the high current among them. The first high current terminals and the second high current terminals of the switching devices 18 are sometimes referred to in device specification sheets as the input and the output terminals of the solid state, high current switching device. A power switching device that is suitable for use in an embodiment of the invention is a "smart high-side power switch" BTS50010-1TAD sold by Infineon Technologies AG.

The first terminal 24 of each first array switching device 18 is directly electrically and thermally bonded to the first switch terminal block 10. In the preferred embodiment, the first terminal 24 of each switching device 18 is a cooling pad of the switching device. The cooling pad is not only a high current conductor for the current being switched by the switching device but also has a sufficient mass and thermal conductivity to serve as a heat conductor for transferring heat away from the switching device to a heat sink.

It is the cooling pad terminal 24 of each first array 20 switching device 18 that is directly electrically and thermally bonded to the first switch terminal block 10. The preferred manner of directly electrically and thermally bonding is soldering, brazing or welding together without any interposed conductor except for the solder or other bonding metal.

Each switching device 18 of the second array 22 also has a high current first terminal 28 and a high current second terminal 30. The first terminal 28 of each switching device 18 in the second array 22 is also a cooling pad of the switching device 18. The first terminal 28 of each second array 22 switching device 18 is directly electrically and thermally bonded to the second switch terminal block 14 in the same manner that the first (cooling pad) terminal 24 of the first array 20 is thermally bonded to the first switch terminal block 10. Neither of the switch terminal blocks 10 and 14 nor any of the high current terminals of the solid state switching devices are electrically connected to the support 12 or to any printed circuit board traces. They do not need to be.

As described above, the first (cooling pad) terminal of each switching device 18 of each of the arrays 20 and 22 is bonded directly to its closest one of the two switch terminal blocks 10 and 14. A bus bar thermal bridge 32 electrically connects together the high current, second terminals (pins) 26 and 30 of each switching device array 20 and 22 so the two arrays 20 and 22 are connected in series. The bus bar thermal bridge 32 is both a heat conductor and a high electrical current conductor. Preferably, it is designed so that the conductivity of its metal and its physical size and configuration, particularly its cross sectional area between connections to the second terminals 26 and 30, results in very low heat generation and consequent power dissipation in it during operation at its maximum continuous current.

One side of the bus bar thermal bridge 32 is directly electrically and thermally bonded to the second terminal 26 of each first array 20 switching device 18 and its opposite side is directly electrically and thermally bonded to the second terminal 30 of each second array 22 switching device 18. In the preferred embodiment, the bus bar thermal bridge 32 is not electrically connected to the support 12 or to any circuit board and is spaced from the support so they do not contact.

Figure 11:
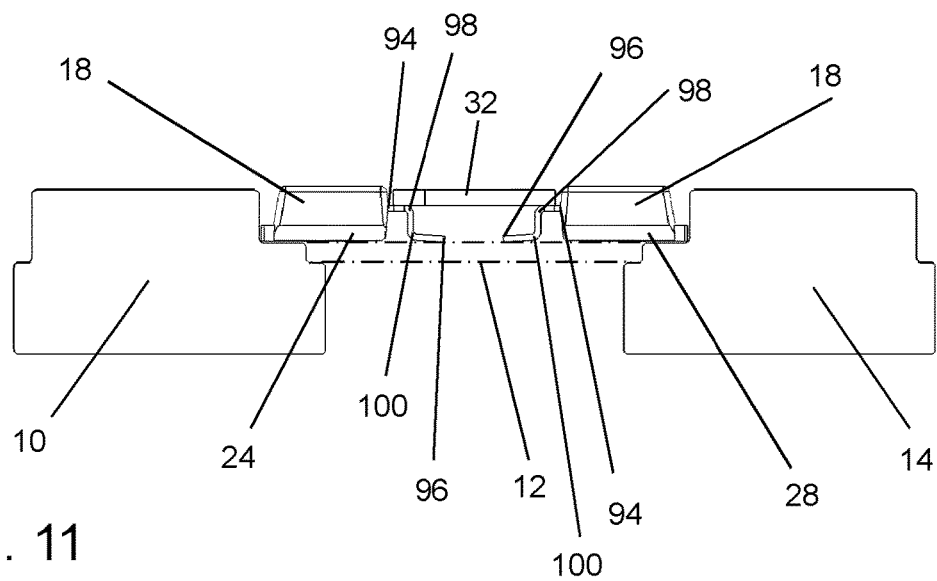
FIG. 11 is a side view of some of the assembled component parts of the embodiment of FIGS. 1-7 illustrating the attachment of the bus bar thermal bridge to the terminal pins of the solid state switching devices.

Preferably and importantly, the bus bar thermal bridge 32 is not bonded at the conventional soldered location at the ends of the second pin terminals 26 and 30 of the switching devices 18. Instead, the thermal bridge is directly electrically and thermally bonded to the high current pin terminals at a physical location on each pin terminal that is spaced from the pin terminal end. Referring to FIG. 11, most integrated circuits, including high current, solid state power switching devices 18, are encapsulated in a plastic, insulated package and have multiple pin terminals. Those terminals protrude outward from an intersection 94 of the pin terminal with a surface of the package and extend to a pin terminal end 96. Typically, each pin terminal has at least one angled bend 98 interposed between the intersection and the terminal end 96. Often there are two bends, one bend 98 that is farther from the terminal end 96 and forms a knee 98 and another bend 100 that is closer to the terminal end 96 and forms a foot. The knee bend 98 is a down turn in order to position the end 96 of the terminal so that it is approximately coplanar with a sidewall of the package. The package is typically mounted to a circuit board with that sidewall against the circuit board. The pins turn down so their ends can be soldered to conductors on the circuit board. However, in embodiments of the invention it is more preferred that the physical location at which the thermal bridge is bonded to a pin terminal is between the further knee bend 98 and the intersection 94. The best and most preferred physical location at which the thermal bridge is bonded to the pin terminal is adjacent the intersection 94 as illustrated in the figures.

There are substantial advantages to be gained from bonding the thermal bridge, or other types of conductors, to the pin terminals of an integrated circuit at the locations described above. An explanation begins with a consideration of the structure of an integrated circuit device. In integrated circuit technology, a plastic insulating package encapsulates a solid state die (i.e. chip) and other internal components including the conductors that electrically connect the die to the terminals (i.e. leads) of the integrated circuit. Those terminals are typically pins and/or cooling tabs. Microelectronic bonding wires are internal metal conductors that go from the die to an interior segment of the device terminals. The bonding wires are usually connected to the terminals near the outer surface of the package and near the above-described intersection 94.

As a consequence of these connections, the effective nominal ON resistance of each solid state switching device, such as a MOS/FET, is the sum of the internal ON resistance of the semiconductor dies+the bonding wire resistance+the terminal resistance.

A major portion of the ON resistance is the resistance of the terminals coming out of the device. One improvement that results from connecting a conductor to the terminals at a location that is described above is that the connection bypasses some and preferably nearly all of the length of the terminals. By bonding the thermal bridge, or other conductor, right where the terminal comes out of the chip package, most of the pin terminal resistance is not connected in the circuit. Therefore heat is not generated in the bypassed segment of the terminal and its resistance is not included in the ON resistance of the entire circuit or switch. Testing provided an example of a pin having a resistance of 1.15 milliohms but when bypassed the resistance became 1.05 milliohms (0.09 milliohm reduction in resistance—approx. 8% reduction).

A second improvement that results from connecting a conductor, such as the thermal bridge 32, to the device 18 terminals in the manner described above arises because the bonding wires are a significant source of heat. The bonding wires in an integrated circuit are commonly bonded to the terminals very close to where the terminals protrude from the package. The bonding of a conductor, such as the thermal bridge, to a terminal at a location that is spaced from the end of the terminal positions the connection closer to the bonding wire. That location improves heat transfer to the connected conductor. Connecting the conductor at the preferred position adjacent the intersection 94 of the terminal with the package exterior surface positions a conductor such as the heat absorbing thermal bridge 32 as physically close as possible to the bonding wires inside the package. Consequently, the thermal resistance from the bonding wires through the device terminals to the thermal bridge or other conductor is minimized. As a result, heat transfer from the bonding wires to the thermal bridge or other conductor is maximized.

In summary, there are two advantageous resistance-lowering results. Most of resistance of the pin terminals is eliminated and heat is more efficiently absorbed from the bonding wires. Improved transfer of heat form the bonding wires maintains the bonding wires at a lower temperature and therefore at a lower resistance. Lowering the resistance of the terminals and the bonding wires reduces the ON resistance of the entire circuit. It also reduces possibility of thermal runaway in which the hotter the bonding wires become the more their resistance increases and as their resistance increases the increased resistance causes more heat generation. The continued repetition of these increases can lead to a thermal runaway condition. We have found that the bus bar thermal bridge connected in the manner described above reduces the effective nominal resistance of a MOS/FET device by more than 3%. Laboratory tests indicate that the effective nominal resistance is reduced by 8.5%.

Figure 5:
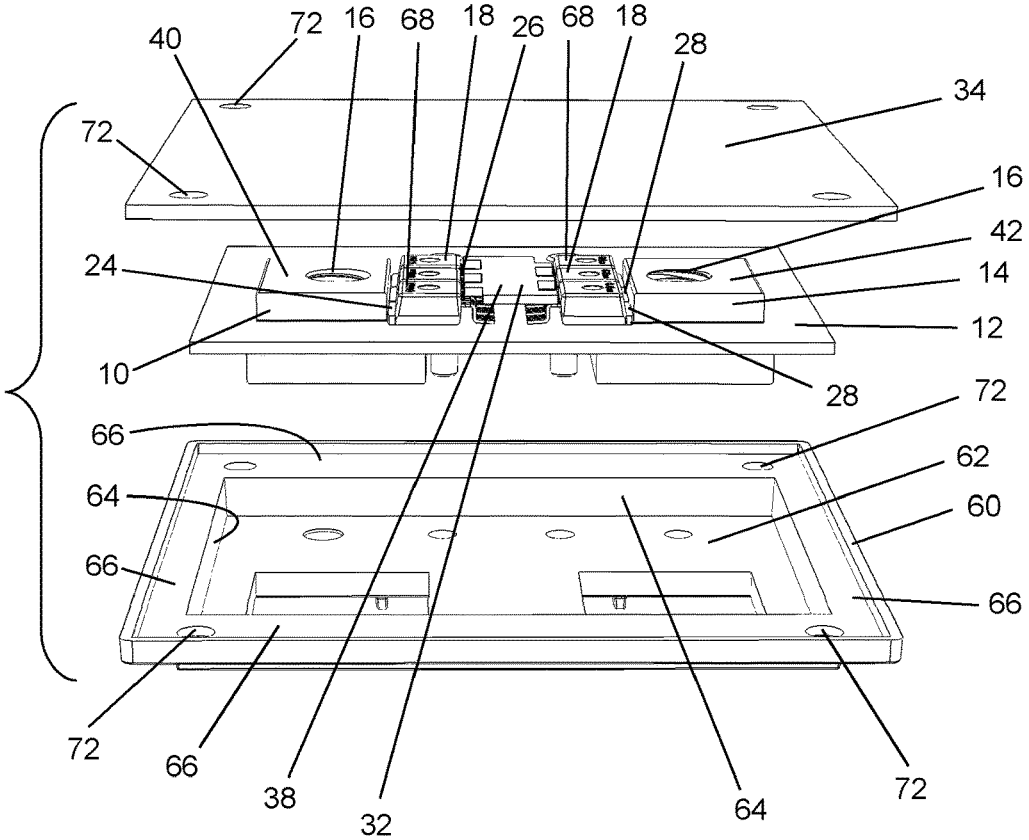
FIG. 5 is an exploded view of the entire embodiment of the invention that is partially illustrated in FIGS. 1-7.
Figure 7:
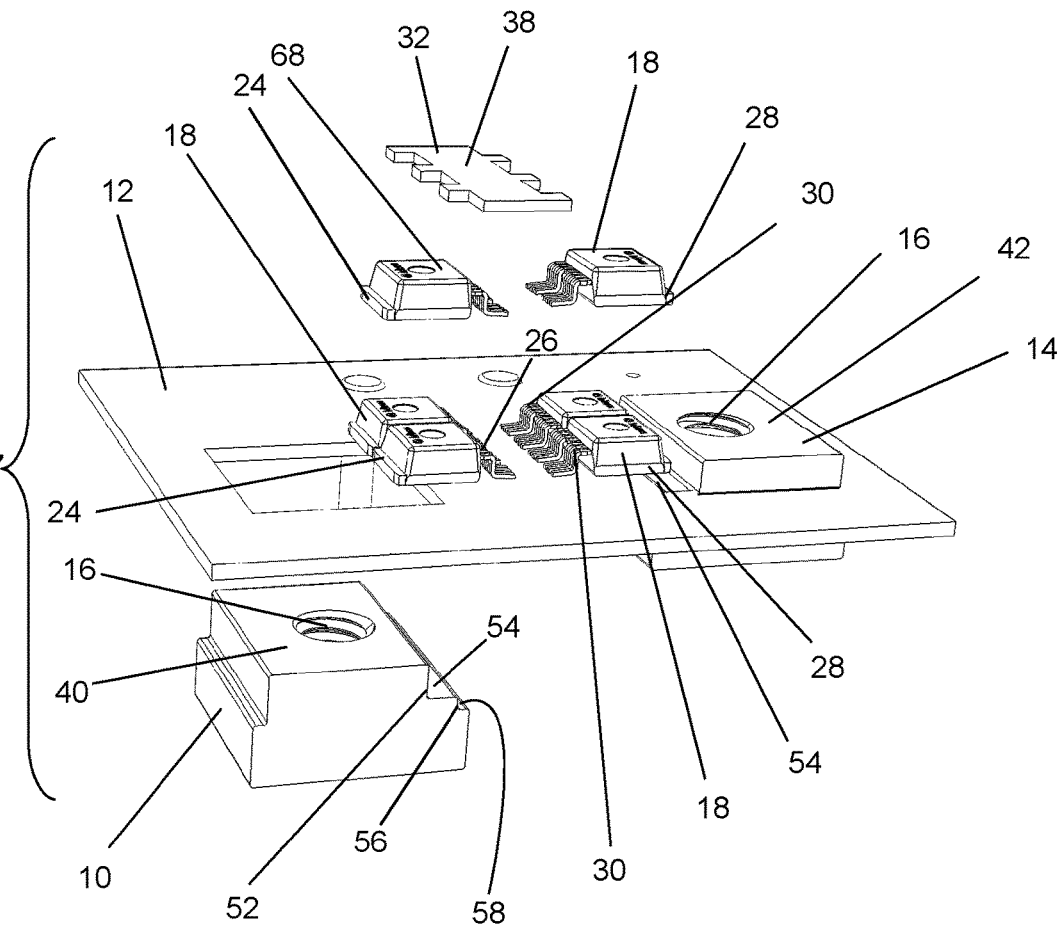
FIG. 7 is an exploded view of the internal components of the embodiment that are illustrated in FIGS. 1-7.
Figures 8, 9:
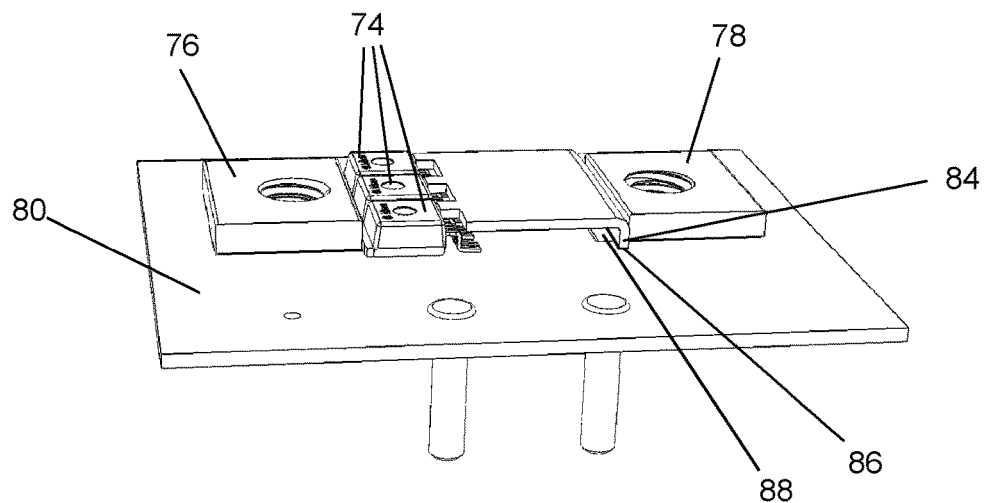
FIG. 8 is a view in perspective similar to the view of FIG. 1 except illustrating the internal components of an alternative embodiment of the invention.
FIG. 9 is a diagrammatic illustration of the heat flow paths in the embodiment of the invention that is illustrated in FIGS. 1-7.
Figure 10:
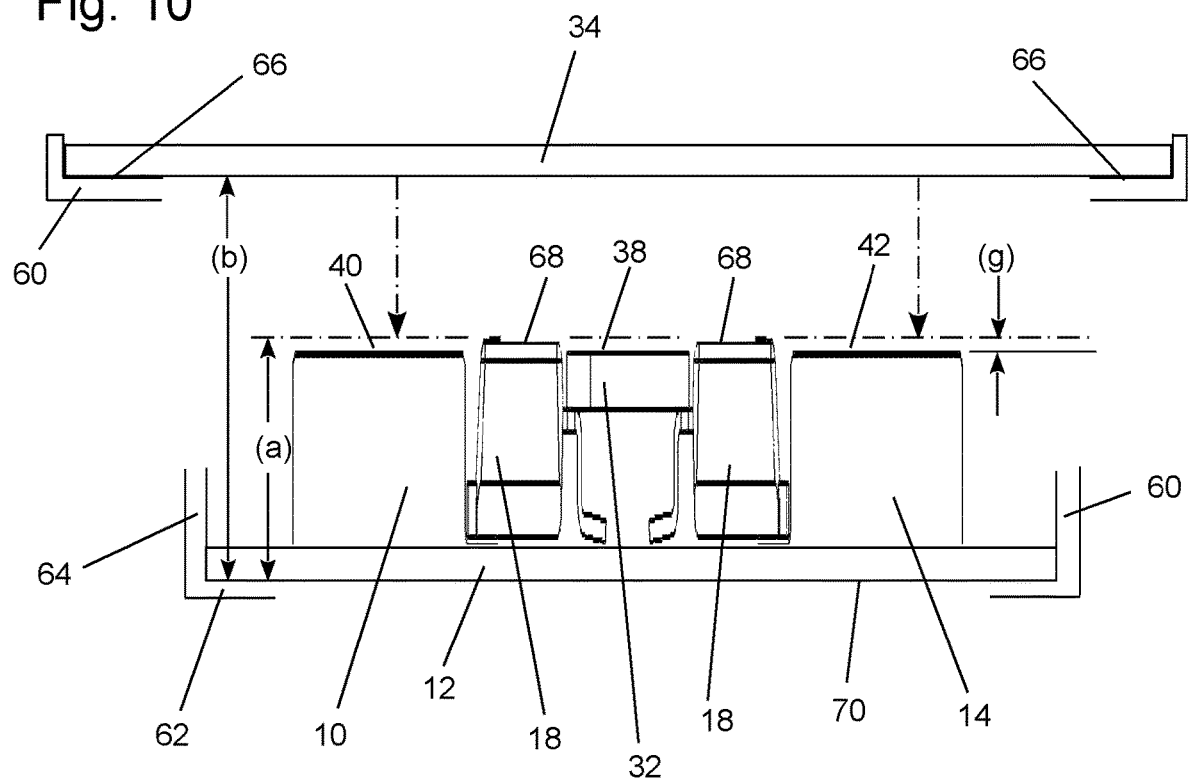
FIG. 10 is a diagrammatic illustration that shows the vertical dimensions extremely exaggerated to provide space for dimension labels.

Referring to FIGS. 5 and 7, a thermally conductive heat sink panel 34 is contoured so that a surface 36 of the panel 34, after assembly, can be positioned in alignment with and in spaced juxtaposition from a heat rejecting surface 38 of the bus bar thermal bridge 32 and from heat rejecting surfaces 40 and 42 of each of the switch terminal blocks 10 and 14. The heat sink panel is a thermally conductive panel that is exposed externally so that it can be thermally connected to an external infinite heat sink. Although the heat sink panel 34 must be thermally conductive, it can be electrically conducting or non-conducting. Preferably, the heat sink panel 34 is, as illustrated, a planar panel and the surfaces 40 and 42 of the terminal blocks 10 and 14 and the surface 38 of the thermal bridge 32 are also planar. This allows the terminal block surfaces 40 and 42 and the thermal bridge surface 38 to be positioned in parallel alignment with, and in spaced juxtaposition from, the surface 36 of the heat sink panel 34. Spaced juxtaposition means that there is a small, preferably uniform, gap 44 between the bus bar thermal bridge 32 and the heat sink panel 34 and also small, preferably uniform gaps 46 and 48 between each of the terminal blocks 10 and 14 and the heat sink panel 34. The gaps are shown in FIGS. 9 and 10 with exaggerated spacing to make them visible. The heat sink panel 34 is preferably metal and the gaps assure that there is no electrical connection to the heat sink panel 34.

In order to provide a thermal heat sink path from the terminal blocks 10 and 14 to the heat sink panel 34 and from the bus bar thermal bridge 32 to the heat sink panel 34, a thermally conductive, electrically insulating thermal interface material 50 (FIG. 9) is applied to fill in the gaps. The thermal interface material 50 contacts and extends between the surface 38 of the bus bar thermal bridge 32, the surfaces 40 and 42 of the switch terminal blocks 10 and 12 and the surface 36 of the heat sink panel 34. Consequently, the thermal interface material 50 conducts heat along parallel paths from the switch terminal blocks 10 and 14 and from the thermal bridge 32 to the heat sink panel 34. The appropriate thermal interface material is a commercially available paste, adhesive, gel, or oxide coated metal. Examples are BERGQUIST SIL PAD TSP 1800, TSE3941-W Silicone Adhesive Sealant available from Momentive Performance Materials Inc. and RTV (Room Temperature Vulcanizing) silicone products.

In order to facilitate bonding the first (cooling pad) terminals 24 and 28 of the power switching devices 18 to their nearest switch terminal block 10 or 14, each of the terminal blocks 10 and 14 has a shoulder 52 (FIG. 7) that forms a ledge 54. The cooling pad first terminals 24 and 28 are directly electrically and thermally bonded to those ledges 54. A second shoulder 56 is formed below the shoulder 52 and has a ledge 58. The plane of the second, lower ledge 58 is spaced from the plane of the first ledge 54 by a distance that is equal to the thickness of the support 12. That spacing allows the lower ledge 58 to seat against one surface of the support 12 and positions the first ledge 54 coplanar with the opposite surface of the support 12. Consequently, the first (cooling pad) terminals 24 and 28 can both lie flatly on the support 12 and on the ledge 54 to which they are bonded.

Figure 6:
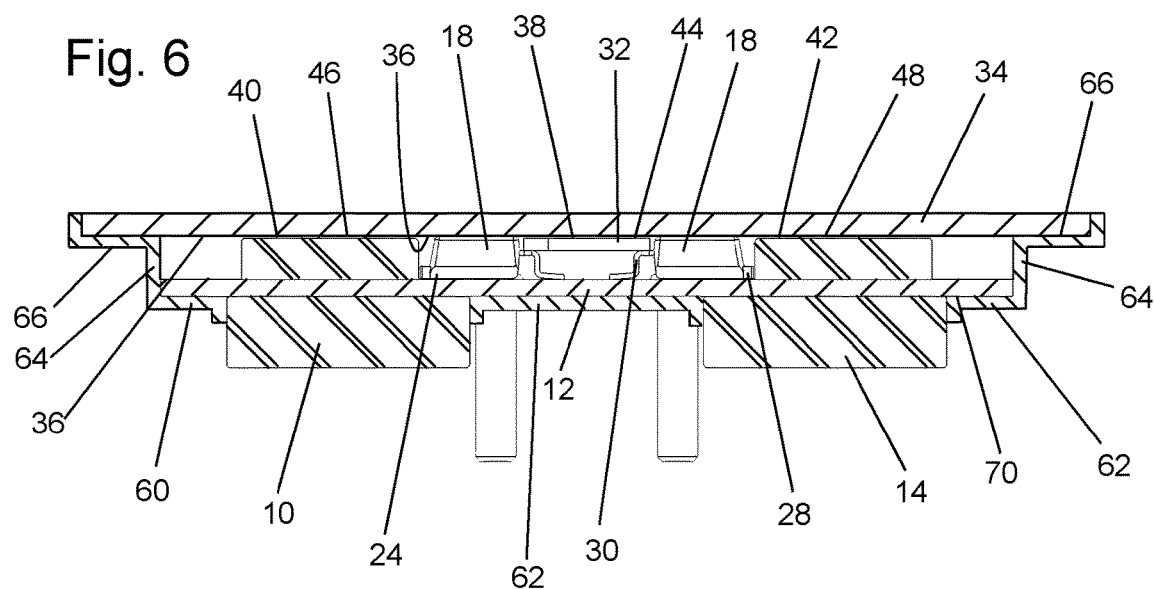
FIG. 6 is a view in section taken substantially along the line 6-6 of FIG. 4 showing the assembled embodiment that is illustrated in FIGS. 1-7.

FIG. 10 is a symbolic drawing that is distorted by being greatly stretched in the vertical direction in order to make space for labelling particular dimensions for use in a description of some dimensional relationships. Referring to FIGS. 5, 6 and 10, the electrical switch is partially surrounded by a non-conducting housing 60. The housing 60 has a planar base 62, side walls 64 and a rim 66 around the side walls 64. The rim 66 is distal from the base 62 and receives and supports the heat sink panel 34. The support board 12 is supported on the base 62. The housing 60 has a distance (b) from its base 62 to its rim 66 that is equal to the distance (a) from the outer sides 68 of the switching devices 18 to the distal side 70 of the support board 12. The purpose of this dimensional relationship is to mechanically support the heat sink panel 34 against the outer sides 68 of the switching devices 18 and against the housing rim 66 in a manner that maintains the heat sink panel 34 spaced by a gap distance (g) from the surfaces 40 and 42 of the terminal blocks 10 and 14 and from the surface 38 of the bus bar thermal bridge 32. These supporting surfaces simplify assembly and assure that the gap, which holds the thermal interface material 50, will have its designed spacing or thickness. Although support of the surrounding edges of the heat sink panel 34 by the housing rim 66 is preferred, the heat sink panel can be supported on only the switching devices 18 if the switching devices 18 have outer sides 68 that are spaced from the support board 12 by a distance that is greater than the distance from the support board 12 to the surfaces 40 and 42 of the terminal blocks 10 and 14 and greater than the distance from the support board 12 to the surface 38 of the bus bar thermal bridge 32.

From the foregoing description it can be seen that the heat sink panel 34 is electrically isolated from the other switch electrical components and is thermally isolated from the support 12 and from the other switch components except for its direct thermally conductive connection through the thermal interface material 50 to the switch terminal blocks 10 and 14 and to the bus bar thermal bridge 32. In accordance with common practice, the embodiment of FIGS. 1-7 is provided with mounting holes 72 for attaching the switch to an "infinite heat sink". An infinite heat sink is a term of art that refers to a large heat accepting mass or radiator, such a vehicle's metal body or chassis component, that is capable of absorbing heat at a rate that will maintain the electronic component at or below a safe temperature.

FIG. 8 illustrates an alternative embodiment of the invention that has only one array of power switching devices 74 arranged in a row. It differs from the other embodiment in its different connection of one end of the bus bar thermal bridge to a switch terminal block. The connection of the FIG. 8 modification is intended to be principally applicable to a power switch with an odd number of arrays of solid state high current switching devices in which the switching devices in each array are connected in parallel with each other and each array is connected in series with any other arrays.

The embodiment of FIG. 8 has two thermally conductive switch terminal blocks 76 and 78 configured and mounted to a support 80 in the same manner as in the previously described embodiment. The power switching devices 74 are attached to the switch terminal block 76 in the same manner as in the previously described embodiment. A bus bar thermal bridge 82 is formed and connected to the pins 84 of the power switching devices 74 in the same manner as in the previously described embodiment. The difference between the FIG. 8 embodiment and the previously described embodiment is the structure of the right side of the bus bar thermal bridge 82 and its connection to the terminal block 78. The right side of the bus bar thermal bridge 82 has a 90°, downturned flange 84. The lower edge 86 of the flange 84 is directly electrically and thermally bonded to the switch terminal block 78 and preferably to a ledge 88 that is formed on the terminal block 78. The embodiment of FIG. 8 also has a thermally conductive heat sink panel that is contoured and arranged like the heat sink panel 34 that was previously described and illustrated and therefore its description is not repeated for FIG. 8. A thermally conductive, electrically insulating thermal interface material thermally contacts and extends between the same surfaces in the FIG. 8 embodiment as in the previously described embodiment.

FIG. 9 is a diagram that illustrates the heat flow paths in embodiments of the invention with the preferred embodiment as an example. In FIG. 9 the gaps 44, 46 and 48 are enlarged so they are visible. Heat flow is shown by the arrows. Electrical cables 88 are connected to cable terminals 90 which are fastened to the terminal blocks 76 and 78 by hex head screws 92. Heat generated in each of the solid state power switching devices 18 is transferred in two opposite directions from each power switching device 18. In one direction heat is transferred directly to a neighboring terminal block and in the opposite direction heat is transferred directly to the bus bar thermal bridge 32. Because the thermally conductive heat sink panel 34 is contoured in alignment with and has a surface in spaced juxtaposition from a surface of the bus bar thermal bridge 32 and from surfaces of each of the switch terminal blocks, any heat transferred into the terminal blocks 10 and 14 and into the bus bar thermal bridge 32 is immediately and directly conducted through the thermal interface material 50 to the heat sink panel 34. Furthermore, heat generated in the cables 88, their terminals 90 and in the interfacing terminal surfaces is also conducted directly to the terminal blocks 10 and 14 and then to the heat sink panel 34.

The terminal block of the invention accomplishes three main things. The first is that it provides an electrical connection between the MOS/FET or other switching device and an outside cable. The second is that it also directs heat from the cable to the heat sink panel and ultimately to an infinite heat sink so that heat from the cable thermally bypasses the MOS/FET or other switching device. The third is that the terminal block absorbs heat from the switching device and transfers that heat directly to the heat sink panel and ultimately to an infinite heat sink.

PARTS REFERENCE NUMBER LIST

10 first terminal block
12 support (board)
14 second terminal block
16 threaded holes in terminal blocks
18 high current, solid state, power switching devices
20 first array of power switching devices
22 second array of power switching devices
24 first high current terminal of first array switching devices
26 second high current terminal of first array switching devices
28 first high current terminal of second array switching devices
30 second high current terminal of second array switching devices
32 bus bar thermal bridge
34 heat sink panel
36 surface of heat sink panel
38 surface of bus bar thermal bridge
40 surface of first switch terminal block
42 surface of second switch terminal block
44 gap adjacent bus bar thermal bridge
46 gap adjacent first terminal block
48 gap adjacent second terminal block
50 thermal interface material
52 shoulders of terminal blocks
54 ledges of terminal blocks
56 second lower shoulders of terminal blocks
58 ledges of lower shoulders of terminal blocks
60 housing
62 planar housing base
64 sidewalls of housing
66 rim of housing
68 outer side of switching devices
70 distal side of support board
72 switch mounting holes
74 power switching devices (FIG. 8)
76 terminal block (FIG. 8)
78 terminal block (FIG. 8)
80 support (FIG. 8)
82 bus bar thermal bridge (FIG. 8)
84 flange on thermal bridge (FIG. 8)
86 lower edge of flange (FIG. 8)
88 electrical cables (FIG. 8)
90 electrical cable terminals (FIG. 8)
92 hex head screws (FIG. 8)
94 intersection of pin terminal with device package
96 pin terminal end
98 angled bend at knee of pin terminal
100 pin terminal bend closer to terminal end This detailed description in connection with the drawings is intended principally as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention and that various modifications may be adopted without departing from the invention or scope of the following claims.

The invention claimed is:

1. A high current, solid state, electrical switch comprising:
   (a) a first thermally conductive switch terminal block configured for carrying high electrical current and mounted to a support;
   (b) a second thermally conductive switch terminal block configured for carrying high electrical current, the second switch terminal block mounted to the support and spaced from the first switch terminal block;
   (c) a first array of parallel connected, solid state, high current, power switching devices supported on the support between the first switch terminal block and the second switch terminal block, each first array switching device having a first array, high current, first terminal and a first array, high current, second terminal, the first terminal of each first array switching device being directly electrically and thermally bonded to the first switch terminal block;
   (d) a second array of parallel connected, solid state, high current, power switching devices supported on the support between the first switch terminal block and the second switch terminal block, each second array switching device having a second array, high current, first terminal and a second array, high current, second terminal, the first terminal of each second array switching device being directly electrically and thermally bonded to the second switch terminal block;
   (e) a bus bar thermal bridge, the thermal bridge being a heat conductor and a high electrical current conductor, the thermal bridge being directly electrically and thermally bonded to the second terminal of each first array switching device and directly electrically and thermally bonded to the second terminal of each second array switching device;
   (f) a thermally conductive heat sink panel contoured in alignment with and having a surface in spaced juxtaposition from a surface of the bus bar thermal bridge and from surfaces of each of the switch terminal blocks; and
   (g) a thermally conductive, electrically insulating thermal interface material thermally contacting and extending between said surface of the bus bar thermal bridge, said surfaces of each switch terminal block and said surface of the heat sink panel for conducting heat from the switch terminal blocks and from the thermal bridge to the heat sink panel.

2. An electrical switch according to claim 1 wherein the bus bar thermal bridge is directly electrically and thermally bonded to the second terminal of each switching device at a physical location on each second terminal that is adjacent an intersection of the second terminal with a surface of a package in which each switching device is encapsulated.

3. An electrical switch according to claim 1 wherein the first terminal of each switching device of each array is a cooling pad.

4. An electrical switch according to claim 2 wherein each of said terminal blocks has a shoulder forming a ledge and said cooling pads are directly electrically and thermally bonded to the ledges of the switch terminal blocks.

5. An electrical switch according to claim 1 wherein the bus bar thermal bridge is spaced from and not in contact with the support.

6. An electrical switch according to claim 1 wherein the heat sink panel is planar and is in planar alignment with said surfaces.

7. An electrical switch according to claim 6 wherein the switching devices have an outer side that is distal from the support and spaced from the support by a distance that is greater than a distance from the support to said surfaces for supporting the heat sink panel in spaced relationship from said surfaces.

8. An electrical switch according to claim 7 wherein the electrical switch is partially surrounded by a non-conducting housing, the housing having a planar base, side walls and a rim around the side walls, the rim being distal from the base and receiving and supporting the heat sink panel, the support being supported on the base, the housing having a distance from the base to the rim edge that is equal to the distance from the outer side of the switching devices to the distal side of the support.

9. An electrical switch according to claim 8 wherein
   (a) the first terminal of each switching device of each array is a cooling pad;
   (b) each of said terminal blocks has a shoulder forming a ledge and said cooling pads are directly electrically and thermally bonded to the ledges of the switch terminal blocks; and
   (c) the bus bar thermal bridge is spaced from and not in contact with the support.

10. A high current, solid state, electrical switch comprising:
    (a) a first thermally conductive switch terminal block configured for carrying high electrical current and mounted to a support;
    (b) a second thermally conductive switch terminal block configured for carrying high electrical current, the second switch terminal block mounted to the support and spaced from the first switch terminal block;
    (c) an array of parallel connected, solid state, high current, power switching devices mounted on the support between the first switch terminal block and the second switch terminal block, each switching device having a high current first terminal and having a high current second terminal, the first terminal of each switching device being directly electrically and thermally bonded to the first switch terminal block;
    (d) a bus bar thermal bridge, the thermal bridge being a heat conductor and a high electrical current conductor, the thermal bridge being directly electrically and thermally bonded to the second terminal of each switching device and directly electrically and thermally bonded to the second switch terminal block;
    (e) a thermally conductive heat sink panel contoured in alignment with and having a surface in spaced juxtaposition from a surface of the thermal bridge and from surfaces of each of the switch terminal blocks; and
    (f) a thermally conductive, electrically insulating thermal interface material thermally contacting and extending between said surface of the bus bar thermal bridge, said surfaces of the switch terminal blocks and said surface of the heat sink panel for conducting heat from the switch terminal blocks and from the thermal bridge to the heat sink panel.

11. An electrical switch according to claim 10 wherein the bus bar thermal bridge is directly electrically and thermally bonded to the second terminal of each switching device at a physical location on each second terminal that is adjacent an intersection of the second terminal with a surface of a package in which each switching device is encapsulated.

12. An electrical switch according to claim 11 wherein the first terminal of each switching device of each array is a cooling pad.

13. An electrical switch according to claim 12 wherein each of said terminal blocks has a shoulder forming a ledge and said cooling pads are directly electrically and thermally bonded to the ledge of the first switch terminal block.

14. An electrical switch according to claim 10 wherein the bus bar thermal bridge is spaced from and not in contact with the support.

15. An electrical switch according to claim 10 wherein the heat sink panel is planar and is in planar alignment with said surfaces.

16. An electrical switch according to claim 15 wherein the switching devices have an outer side that is distal from the support and spaced from the support by a distance that is greater than a distance from the support to said surfaces for supporting the heat sink panel in spaced relationship from said surfaces.

17. An electrical switch according to claim 16 wherein the electrical switch is housed in a non-conducting housing, the housing having a planar base, side walls and a rim around the side walls, the rim having an edge that is distal from the base and the rim edge receiving and supporting the heat sink panel, the support being supported on the base, the housing having a distance from the base to the rim edge that is equal to the distance from the outer side of the switching devices to the support.

18. An electrical switch according to claim 17 wherein
(a) the first terminal of each switching device of each array is a cooling pad;
(b) each of said terminal blocks has a shoulder forming a ledge and said cooling pads are directly electrically and thermally bonded to the ledge of the first switch terminal block and the second terminal of each switching device being connected to the ledge of the second terminal block; and
(c) the bus bar thermal bridge is spaced from and not in contact with the support.

19. A high current, solid state, switch for controlling the current through connected electrical cables, the apparatus comprising:
(a) a first thermally conductive terminal block mounted to a support and configured for connection to one of the cables for carrying high electrical current;
(b) a thermally conductive heat sink panel contoured in alignment with and having a surface in spaced juxtaposition from a surface of the terminal block; and
(c) a thermally conductive, electrically insulating thermal interface material thermally contacting and extending between said surface of the terminal block and the surface of the heat sink panel for conducting heat directly from the switch terminal block to the heat sink panel.

20. An apparatus according to claim 19 and further comprising:
a solid state, high current, power switching device supported on the support, the power switching device having a high current terminal or lead that is a cooling pad, the cooling pad being directly electrically and thermally bonded to the switch terminal block.

21. An apparatus according to claim 20 wherein the heat sink panel is planar, the surface of the terminal block is planar and the surfaces are in planar alignment.

22. An improved electrical circuit that includes a high current, solid state power switching device encapsulated in a package and having at least one high current pin terminal that protrudes outward from an intersection of the pin terminal with a surface of the package and extends to a pin terminal end, wherein the improvement comprises:
a bus bar thermal bridge, the thermal bridge being a heat conductor and a high electrical current conductor, the thermal bridge being directly electrically and thermally bonded to the high current pin terminal at a physical location on the pin terminal that is spaced from the pin terminal end.

23. An electrical circuit according to claim 22 wherein the pin terminal has an angled bend interposed between said intersection and said terminal end and wherein the physical location at which the thermal bridge is bonded to the pin terminal is between said bend and said intersection.

24. An electrical circuit according to claim 22 wherein the physical location at which the thermal bridge is bonded to the pin terminal is adjacent said intersection.

25. An electrical circuit according to claim 22 and further comprising:
(a) a thermally conductive heat sink panel contoured in alignment with and having a surface in spaced juxtaposition from a surface of the thermal bridge; and
(b) a thermally conductive, electrically insulating thermal interface material thermally contacting and extending between the surface of the thermal bridge and the surface of the heat sink panel for conducting heat directly from the thermal bridge to the heat sink panel.

* * * * *